United States Patent [19]

Coleman, Jr.

[11] Patent Number: 5,668,550
[45] Date of Patent: Sep. 16, 1997

[54] WEIGHTED CURRENT SOURCE FOR A DIGITAL-TO-ANALOG CONVERTER

[75] Inventor: Edward P. Coleman, Jr., Fairport, N.Y.

[73] Assignee: PSC, Inc., Webster, N.Y.

[21] Appl. No.: 582,946

[22] Filed: Jan. 4, 1996

Related U.S. Application Data

[63] Continuation of Ser. No. 366,566, Dec. 30, 1994, Pat. No. 5,594,441.

[51] Int. Cl.$^6$ .................................................. H03M 1/06
[52] U.S. Cl. .................. 341/119; 341/144; 341/154
[58] Field of Search .................................. 341/118, 119, 341/136, 144, 153, 154

[56] References Cited

U.S. PATENT DOCUMENTS

| | | | |
|---|---|---|---|
| 4,424,461 | 1/1984 | Taguchi et al. | 307/491 |
| 4,431,986 | 2/1984 | Haque et al. | 340/347 AD |
| 4,546,275 | 10/1985 | Pena-Finol et al. | 307/498 |
| 4,766,415 | 8/1988 | Dielacher | 340/347 DA |
| 4,800,365 | 1/1989 | White et al. | 341/119 |
| 4,808,847 | 2/1989 | Van Kessel | 307/297 |
| 4,899,152 | 2/1990 | Barrow et al. | 341/154 |
| 4,980,836 | 12/1990 | Carter et al. | 364/483 |
| 4,982,192 | 1/1991 | Murooka | 341/127 |
| 5,134,398 | 7/1992 | Yasutake et al. | 341/119 |
| 5,155,385 | 10/1992 | Gotoh et al. | 307/296.8 |
| 5,221,890 | 6/1993 | Shyu et al. | 323/317 |
| 5,293,166 | 3/1994 | Ta | 341/118 |
| 5,446,457 | 8/1995 | Ryat | 341/136 |
| 5,483,150 | 1/1996 | Elliott et al. | 323/312 |

*Primary Examiner*—Jeffrey A. Gaffin
*Assistant Examiner*—Jason L. W. Kost
*Attorney, Agent, or Firm*—Foley & Lardner

[57] ABSTRACT

A D/A converter having a bias circuit that supplies a well-compensated gate voltage to a weighted current source part of the D/A converter, so that any changes in component characteristics due to the manufacturing of the components making up the D/A converter or due to temperature variations in the D/A converter are compensated for to output a correct analog voltage.

The bias circuit comprises an amplifier and a p-type FET, where the drain of the p-type FET is fed back to a non-inverting input of the amplifier, and a reference voltage is applied to an inverting input of the amplifier. The bias circuit operates in a negative feedback condition, such that the non-inverting input is kept as close to the reference voltage as possible. A first resistor is connected to the drain of the p-type FET, to determine the current at the drain of the p-type FET. The weighted current source is made up of FETs having similar operating characteristics as the p-type FET of the bias circuit.

14 Claims, 3 Drawing Sheets

WEIGHTED CURRENT SOURCE FOR A DIGITAL-TO-ANALOG CONVERTER

This application is a continuation of application Ser. No. 08/366,566, filed Dec. 30, 1994 now U.S. Pat. No. 5,594,441 issued Jan. 14, 1997.

BACKGROUND OF THE INVENTION

1. Field of the Invention

The invention relates to a bias circuit for use with a weighted current source of a digital-to-analog converter. In particular, the invention relates to a bias circuit supplied to a weighted current source component of the digital-to-analog converter, to provide a well-compensated gate voltage to the weighted current source, and thereby allow for precise conversion of an n-bit digital word to an analog signal.

2. Description of the Related Art

In designing and manufacturing digital-to-analog converters (D/A) as an application specific integrated circuit (ASIC), problems arise in that the electrical characteristics of the individual components making up the ASIC may vary with temperature and may not maintain the precise values that they are designed for. For example, parameters of a 1 kohm resistor used in an ASIC may vary as the temperature of the ASIC varies. Additionally, when manufacturing ASICs, individual components of the ASIC may vary from their specified values by 50% or more. Again, for example, a resistor may be designed to have a resistance of 1 kohm, but the ASIC manufacturing process may result in that resistor having an actual resistance of 1.5 kohm.

Given this uncertainty in component characteristics due to the manufacturing process of ASICs, as well as the fact that individual components in an ASIC have characteristics that vary with temperature, a problem exists in that even though the D/A ASIC is designed to operate properly and precisely, in actual practice it does not perform well due to the temperature variations and/or manufacturing inaccuracies introduced.

It is therefore desirable to have a D/A ASIC that accurately performs D/A conversion even with temperature variations, and that operates the same even with variations in the actual individual components of the D/A ASIC due to manufacturing inaccuracies of the individual ASIC components.

SUMMARY OF THE INVENTION

It is therefore an object of the invention to have a D/A which includes a bias circuit to ensure that the D/A operates in a consistently constant condition regardless of the temperature applied to the D/A or the actual operating characteristics of the individual components of the D/A, as compared with their specified operating characteristics.

In accordance with this object, the invention is directed to a Digital to Analog converter, including a bias FET having a gate, a source and a drain, the bias FET having a predetermined channel width and length and the source of the bias FET connected to a high DC voltage terminal. The Digital to Analog converter further includes an amplifier having an output terminal, an inverting input terminal and a non-inverting input terminal, the output terminal being connected to the gate of the bias FET, the inverting input terminal being connected to a reference voltage, and the non-inverting input terminal being connected to the drain of the bias FET, wherein the amplifier acts as a negative feedback amplifier. The Digital to Analog converter according to the invention still further includes a resistor having a first end being connected to the drain of the bias FET and having a second end being connected to a low DC voltage terminal, and a weighted current source having n input ports for simultaneously receiving an n-bit digital word. The current source includes n FETs each respectively connected to one of the n input ports and having a gate input connected to the output of the amplifier. Respective drains of each of the n FETs are coupled together at an output port. The gate input is connected to the respective gates of the n FETs and each of the n FETs has a predetermined channel width and length. The output of the amplifier supplies a compensated gate voltage to each of the n FETs to compensate for changes in operating characteristics of the Digital to Analog converter.

BRIEF DESCRIPTION OF THE DRAWINGS

The invention is set forth with particularity in the appended claims. The invention, together with further objects and advantages thereof, may best be understood by making reference to the following description taken in conjunction with the accompanying drawings, wherein:

DETAILED DESCRIPTION OF THE PREFERRED EMBODIMENTS

Figure 1:
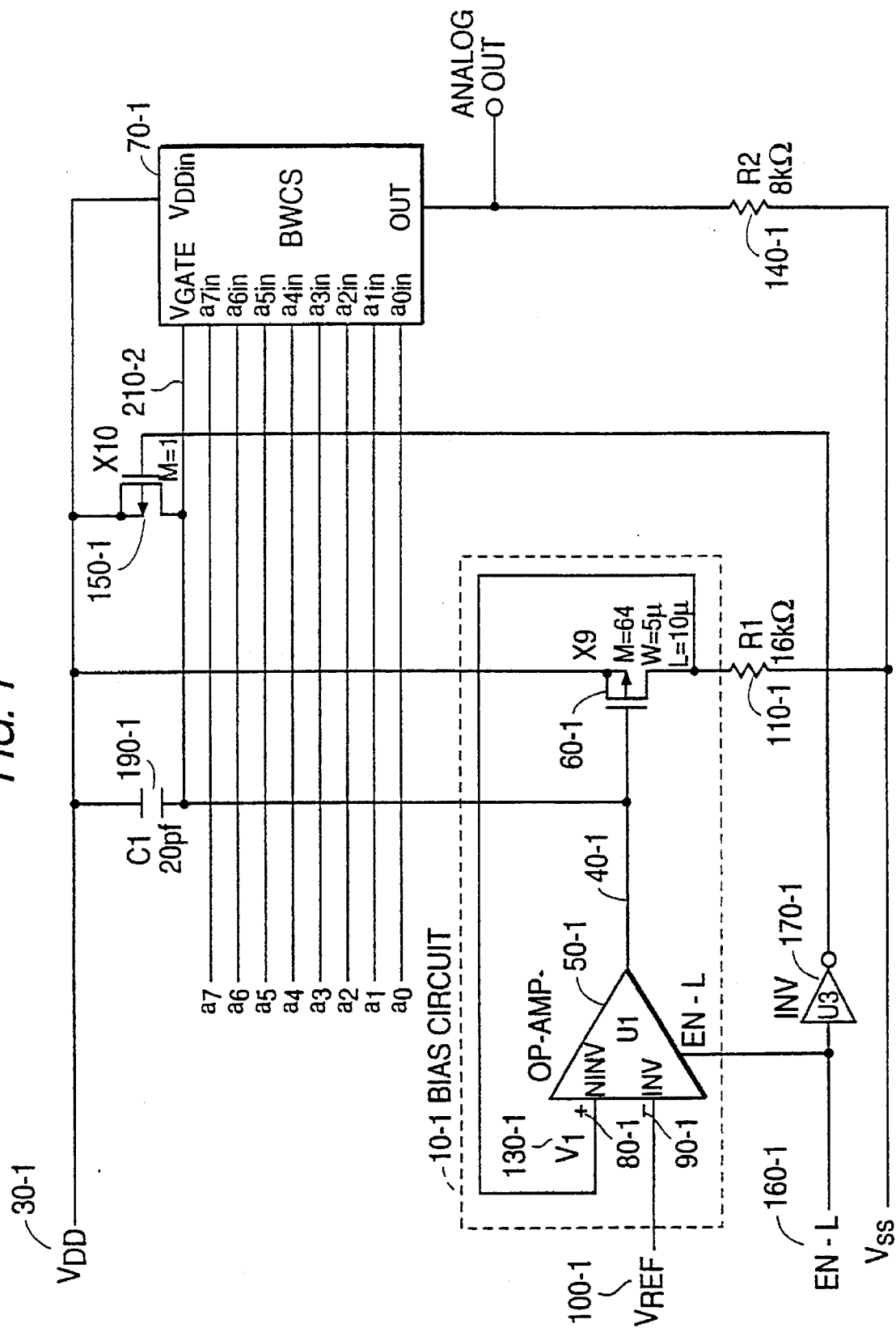
FIG. 1 is a block diagram of the D/A according to a first embodiment of the invention.

A block diagram of the D/A converter according to a first embodiment is given in FIG. 1. Operational amplifier U1 50-1 and p-type field-effect transistor (FET) X9 60-1 together make up the bias circuit 10-1 that supplies a constant voltage across resistor R1 110-1 and which also supplies a well-compensated gate voltage to the binary weighted current source (BWCS) 70-1.

The D/A includes the bias circuit 10-1 and the BWCS 70-1. In the bias circuit 10-1, the gate of FET X9 60-1 is connected to the output port 40-1 of operational amplifier U1 50-1, and the drain of FET X9 60-1 is connected to a non-inverting input 80-1 of U1 50-1. A reference voltage $V_{ref}$ 100-1 is supplied to an inverting input 90-1 of U1 50-1. The bias circuit 10-1 is configured to maintain the voltage potential through resistor R1 110-1 equal in magnitude to $V_{ref}$, no matter how the individual components of the D/A vary due to temperature variations and/or manufacturing inaccuracies in the operating characteristics of these individual components of the D/A ASIC, and the like.

Figure 2:
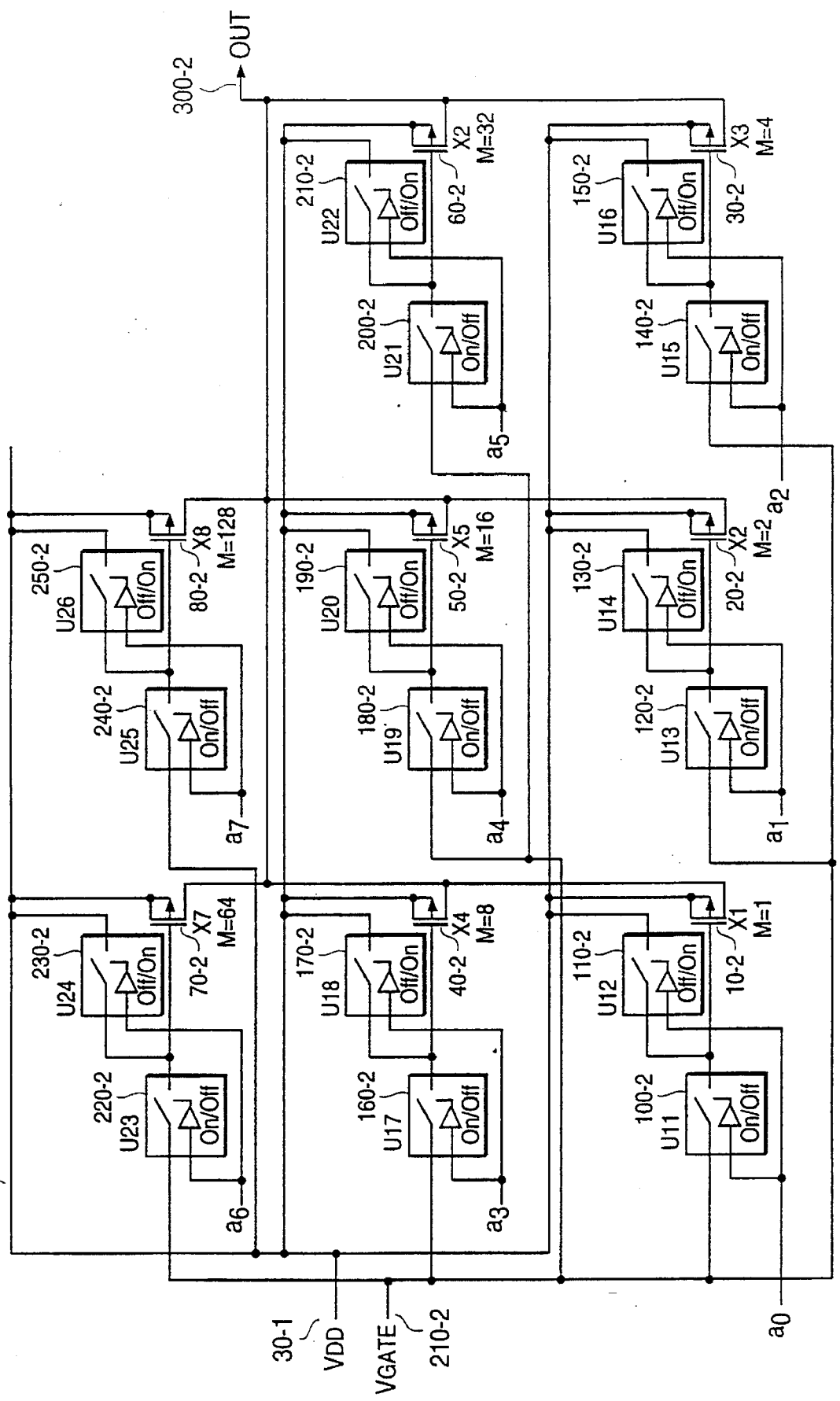
FIG. 2 is a block diagram of the binary weighted current source of the D/A according to the first embodiment of the invention.

A gate voltage is supplied to FET X9 60-1 that is needed to output an amount of drain current across resistor R1 110-1 in order to maintain a constant potential across R1 110-1. This gate voltage is also supplied to the gates of each of the FETs X1 10-2 through X8 80-2 of the BWCS 70-1, as can be seen in FIG. 2 by the gate voltage Vgate 210-2 supplied to the BWCS 70-1. The well compensated gate voltage supplied to the BWCS 70-1 guarantees that the D/A operates in a consistently constant condition even when the specified operating characteristics of the FETs making up the D/A ASIC vary or when temperature fluctuations occur which may affect the operational characteristics of certain of the components making up the D/A ASIC.

Referring back to FIG. 1, in the first embodiment, $V_{ref}$ is equal, for example, to 1.2 volts. $V_{ref}$ can be set to any particular voltage level while still keeping within the scope of the invention. Operational amplifier U1 50-1 is configured as a feedback amplifier, with the voltage at the drain of FET X9 60-1 being fed back to the non-inverting input 80-1 of U1 50-1. By this configuration, any change in the drain voltage of FET X9 60-1 is fed back to U1 50-1, and the operational amplifier U1 50-1 acts on both the value of the feedback signal, V1 130-1, and on $V_{ref}$ 100-1. Essentially, FET X9 60-1 in combination with operational amplifier U1 50-1 act as a voltage follower circuit, in which the voltage at the drain of FET X9 60-1, which corresponds to the voltage across resistor R1 110-1, follows the voltage $V_{ref}$ 100-1.

U1 50-1 preferably should have a relatively large open loop gain in order to ensure that the voltage fed back to the non-inverting input 80-1 of U1 50-1 is kept very close to $V_{ref}$ 100-1. With U1 50-1 having a large voltage gain, any difference in potential between $V_{ref}$ 100-1 at the inverting input 90-1 of U1 50-1 and the voltage V1 130-1 at the non-inverting input 80-1 of U1 50-1 will be magnified at the output port 40-1 of U1 50-1 due to the gain of U1 50-1. Therefore, the larger the voltage gain of U1 50-1, the more closely the voltage at the non-inverting input 80-1 of U1 50-1 will match the voltage at the inverting input 90-1 of U1 50-1.

If the voltage V1 130-1 at the non-inverting input 80-1 of U1 50-1 is higher than the voltage $V_{ref}$ 100-1 at the inverting input 90-1 of U1 50-1, then the voltage 40-1 output from U1 50-1 will go higher. Since FET X9 60-1 is a p-type device, this higher output voltage 40-1 from U1 50-1 will drive the p-type FET X9 60-1 less hard, which in turn will cause a reduction in the amount of current flowing from the drain of FET X9 60-1. This reduced amount of current flowing from the drain of FET X9 60-1 will flow through resistor R1 110-1 and result in a lower voltage at the drain of FET X9 60-1. This lower voltage at the drain of FET X9 60-1 will be fed back as V1 130-1 to the non-inverting input 80-1 of U1 50-1 as negative feedback, thereby resulting in the voltage V1 130-1 closely matching the voltage $V_{ref}$ 100-1.

On the other hand, if the voltage V1 130-1 at the non-inverting input 80-1 of U1 50-1 is lower than the voltage $V_{ref}$ 100-1 at the inverting input 90-1 of U1 50-1, this will result in the output voltage 40-1 of U1 50-1 decreasing. This lower output voltage 40-1 will then be fed to the gate of p-type FET X9 60-1, thereby increasing the amount of drain current flowing from FET X9 60-1, and thereby producing a greater voltage across resistor R1 10-1. This greater voltage will be fed back to the non-inverting input 80-1 of U1 50-1 as voltage V1 130-1 in a negative feedback arrangement. In this case as well, V1 30-1 will also closely match V=f 100-1.

When V1 130-1 exactly matches $V_{ref}$ 100-1, that is, when the voltage supplied to the non-inverting input 80-1 of U1 50-1 matches the voltage supplied to the inverting input 90-1 of U1 50-1, the output voltage 40-1 of U1 50-1 corresponds to the gate voltage necessary to output the correct amount of drain current flowing from FET X9 60-1 to obtain a voltage approximately equal to $V_{ref}$ across resistor R1 110-1. As shown in FIG. 2, this well-compensated gate voltage is also supplied to the gates of FETs X1 10-2 through X8 80-2 of the BWCS 70-1 as signal $V_{gate}$ 210-2 in order to ensure that the BWCS 70-1 operates in a proper condition no matter how temperature variations or manufacturing inaccuracies have affected operating characteristics of the individual components making up the D/A ASIC.

Referring back to FIG. 1, the voltage follower setup of the bias circuit 10-1 is constructed to ensure that the voltage across R1 110-1 is always approximately equal to $V_{ref}$ 100-1. If the resistance of resistor R1 110-1 changes and/or the operating characteristic of FET X9 60-1 changes such that the voltage across R1 110-1 drops below $V_{ref}$ 100-1, then the operational amplifier U1 50-1 outputs a lower voltage 40-1 to the gate of FET X9 50-1 than it would have if the voltage across R1 100-1 was equal to $V_{ref}$. As stated above, since FET X9 60-1 is a p-type device, this voltage reduction causes more current to flow from the drain of FET X9 60-1, which in turn increases the voltage across R1 110-1.

For example, if the resistance value of R1 110-1 decreases from 16 kohms to 12 kohms due to a temperature change in the D/A ASIC, that change in resistance would cause the voltage across R1 110-1 to drop by a ratio of 12:16, or by 75%. If the voltage across R1 110-1 was initially 1.2 volts when R1 had a resistance of 16 kohms, then the voltage across R1 110-1 would become 1.2 volts *12/16 =0.9 volts at the instant R1 110-1 changed resistance to 12 kohms. This 0.9 volt value would then be fed back as voltage V1 130-1 to the non-inverting input 80-1 of U1 50-1, and would consequently cause a decreased output voltage 40-1 from U1 50-1. This decreased output voltage 40-1 from U1 50-1 is supplied to the gate of p-type FET X9 60-1, causing an increase in current from the drain of FET X9 60-1. This increased current will flow through resistor R1 110-1, pushing up the voltage fed back as V1 130-1 to the non-inverting input 80-1 of U1 50-1 to approach $V_{ref}$ 100-1.

With this feedback configuration, the increase in current value across R1 110-1 will compensate for the drop in resistance of R1 110-1. Therefore, the bias circuit 10-1 will act to keep the voltage across R1 110-1 at a constant level (approximately equal to $V_{ref}$), regardless of the changes in the operating characteristics of the individual components of the ASIC. The example given above was based on the result of a resistance change in R1 110-1. However, the change in voltage read across R1 110-1 could just as well have been due to a change in one of the operating characteristics of FET X9 60-1, such as a change in the output gain of FET X9 60-1. If the output gain of FET X9 60-1 happened to drop, that is, if for a specified gate voltage the drain current is less than what it was before, then the voltage follower construction of the bias circuit 10-1 will cause a lesser amount of output voltage 40-1 from U1 50-1 to be applied to the gate of FET X9 60-1 than before, and thereby cause an increase in the output drain current flowing from FET X9 60-1 to compensate for the change in the operating characteristic of FET X9 60-1.

One of ordinary skill in the art will recognize in application specific integrated circuit (ASIC) design and manufacturing, that although the actual values of particular components may be substantially different from their specified values (i.e., FET output current gain, resistor resistance value), the ratios of these components with respect to each other does not change measurably if these components are constructed in a same lot or deposition process.

For instance, assume that R1 110-1 has a resistance value at a temperature $T_0$ equal to 16 kohm and R2 140-1 has a resistance value at temperature $T_0$ equal to 8 kohm. If the temperature of the A/D ASIC changes from $T_0$ to $T_1$ such that R1 110-1 now has a resistance value equal to ¾ of its resistance value at temperature $T_0$, then R2 140-1 will also have its resistance change to approximately ¾ of its resistance value at temperature $T_0$, and consequently the ratio of R1 to R2 will remain at a ratio of 2:1.

Also, if R1 110-1 and R2 140-1 are manufactured in the same wafer lot to have respective resistance values of 16 kohm and 8 kohm, then even if the actual resistance values of these two devices deviated from their specified values by, say, 40%, the ratio of R1 110-1 to R2 140-1 will still be at a ratio of 2:1. The ratio of R1 110-1 and R2 140-1 is important in obtaining a precise analog output for the D/A ASIC. So, as long as it can be guaranteed that R1 110-1 and R2 140-1 have a particular ratio with respect to each other, regardless of their actual values, the bias circuit 10-1 will operate to ensure that the correct voltage is supplied to the FETs X1 10-2 through X8 80-2 of the BWCS 70-1.

In the first embodiment, FET X9 60-1 has a channel length of, for example, approximately 10 microns and a channel width of, for example, approximately 5 microns. Since FET X9 60-1 has a relatively long channel length, the current through X9 60-1 is primarily a function of the gate-to-source gate-to-source voltage and is therefore relatively independent of the drain voltage. Increasing the channel length of the FET X9 60-1 results in a decrease in the channel length modulation of that device. Since the output drain current of a FET is both a function of gate voltage and drain-to-source voltage multiplied by the channel length modulation, by decreasing the channel length modulation term by increasing the channel length, the output drain current becomes dependent only on the gate voltage of the FET.

Increasing the channel length for a FET reduces the area available on the ASIC for other components, so an appropriate channel length must be chosen given the objectives of having the drain current independent of the drain voltage while not taking up much room on the ASIC with long channel lengths. In the first embodiment, the channel lengths and widths of the FET X9 60-1 and each of the FETs X1 10-2 through X8 80-2 in the BWCS 70-1 are equal to each other, since they must be identical elements in order for the bias circuit 10-1 to properly supply the correct amount of gate voltage to the BWCS 70-1.

FIG. 2 shows that the output voltage 40-1 from U2 50-1 is fed to each of the gates of the FETs X1 10-2 through X8 80-2 of the BWCS 70-1, as input signal Vgate 210-2. One important feature Of the invention is that FET X9 60-1 has similar operating characteristics as the FETs X1 10-2 through X8 80-2 of the BWCS 70-1. As mentioned earlier, in the first embodiment, FET X9 60-1 of the bias circuit 10-1 is a single p-type FET, with a channel width of 5 microns and a channel width of 10 microns. Each of the FETs X1 10-2 through X8 80-2 in the BWCS 70-1 include a predetermined number of similar p-type FETs, with each of the p-type FETs making up the respective FETs X2 20-2 through X8 80-2 having a channel length of 5 microns and a channel width of 10 microns.

The only difference between the FETs X1 10-2 through X8 80-2 is in their respective output gains due to their respective integer multipliers m. The integer multiplier m is equivalent to "m" 5-micron by 10-micron p-type FETs connected in parallel (connected gate to gate, drain to drain, and source to source). For example, FET X8 80-2 actually comprises 128 p-type FETs connected in parallel, while FET X7 70-8 actually comprises 64 p-type FETs connected in parallel. Any difference between a specified operating characteristic and an actual operating characteristic due to the manufacturing of the FET X9 60-1 and/or any change in temperature that causes the actual operating characteristic of FET X9 60-1 to vary will cause identical characteristic variances to the FETs X1 10-2 through X8 80-2 making up the BWCS 70-1.

Preferably, the gain of FET X9 60-1 of the bias circuit 10-1 is matched to one of the FETs X1 10-2 through X8 80-2 making up the BWCS 70-1, though this need not necessarily be so. In the first embodiment, the operating characteristics of FET X9 60-1 are matched to FET X7 70-2 of the BWCS 70-1, since they have identical channel sizes and they have an output gain factor (m) of 64. Therefore, when the same amount of voltage is applied to the gate and the source of X7 70-2 of the BWCS 70-1 and to the gate and the source of X9 60-1 of the bias circuit 10-1, the same amount of current will flow from the respective drains of these two FETs.

The first embodiment as shown in FIGS. 1 and 2 is for an 8-bit D/A converter. The BWCS 70-1 includes eight FETs X1 10-2 through X8 80-2, each having an appropriate gain value for a respective bit of a digital word that is to be converted to an analog value. For example, in FIG. 2, FET X1 10-2 of the BWCS 70-1 is used to convert bit $a_0$ and has a gain of $2^0 = 1$, FET X2 20-2 of the BWCS 70-1 is used to convert bit $a_1$ and has a gain of $2^1 = 2$, FET X3 30-2 of the BWCS 70-1 is used to convert bit $a_2$ and has a gain of $2^2 = 4$, and so on. Lastly, FET X8 80-2 of the BWCS 70-1 is used to convert bit $a_7$ and has a gain of $2^7 = 128$. However, the invention may be implemented for an n-bit D/A converter and still keep within the teachings of the invention. For an n-bit D/A converter, one would need n FETs in the BWCS 70-1, with respective gains of $1, 2, 4, \ldots, 2^{n-2}, 2^{n-1}$.

Referring now to FIG. 2, bit $a_0$, which corresponds to the least significant bit (LSB) of the input digital word $a_7 a_6 a_5 a_4 a_3 a_2 a_1 a_0$, is supplied to an on/off input of on/off switch U11 100-2. The well-compensated gate voltage obtained from the output 40-1 of U1 50-1 of the bias circuit 10-1 is received by the BWCS 70-1 as input signal $V_{gate}$ 210-2 and is supplied to the input port of on/off switch U11 100-2. For each of switches U11 through U26 as shown in FIG. 2, the input port is shown on the left side and the output port is shown on the right side of the corresponding switch.

Setting bit $a_0$ to a High value (i.e., =1) closes the switch, thereby connecting the input port of U11 100-2 to the output port of U11 100-2. Since the output port of U11 100-2 is coupled to the gate of FET X1 10-2, the gate voltage applied is Vgate 210-2, which corresponds to the amount of gate voltage needed to output the correct amount of drain current from FET X1 10-2 when bit $a_0$ is set to a High value. The on/off not-switch (or n-switch) U12 110-2 is configured to ensure that when a0 is set to a Low value (i.e., =0), the gate voltage supplied to X1 10-2 is set to a High value, which in the preferred embodiment is the value re. A gate voltage equal to $V_{dd}$ 30-1 supplied to FET X1 10-2 ensures the FET X1 10-2 is turned off when $a_0$ is at a Low value.

This same arrangement occurs for the seven higher order bits of the eight-bit digital word, with each digital bit having its own respective p-type FET (X1 10-2 through X8 80-2), its own respective on/off switch (U11 100-2, U13 120-2, U15 140-2, U17 160-2, U19 180-2, U21 200-2, U23 220-2, U25 240-2) and its own respective on/off n-switch (U12 110-2, U14 130-2, U16 150-2, U18 170-2, U20 190-2, U22 210-2, U24 230-2, U26 250-2).

Setting any of the digital bits to a High condition acts to turn on the respective FET for that bit. For example, if $a_2$ is set to a High value, the well-compensated gate voltage obtained from the output port 40-1 of U1 50-1 of the bias circuit 10-1 is applied to FET X3 30-2, thereby turning on FET X3 30-2. FET X3 30-2 has a preset gain such that it acts to output $4 \cdot *I_{drain}$, where $I_{drain}$ corresponds to the amount of drain current output from FET X1 10-2 for the same gate voltage level (i.e., FET X1 10-2 is the FET corresponding to the least significant bit $a_0$ of the digital word input to the BWCS 70-1).

All of the FETs X1 10-2 through X8 80-2 of the BWCS 70-1 have their respective drains supplied to a common output port 300-2. As a result, the total current output from the BWCS 70-1, which corresponds to the sum of the drain currents of each of the FETs X1 10-2 through X8 80-2, represents the analog current signal corresponding to the digital word $a_7a_6a_5a_4a_3a_2a_1a_0$. This current can be converted to an analog voltage value by flowing through resistor R2 140-1, as shown in FIG. 1. Thus, if the digital word was $10000010=130_{base10}$, then bit $a_7$ and bit $a_1$ would be input to the BWCS 70-1 as a "one" and all of the other bits would be input to the BWCS 70-1 as a "zero". This would cause FET X8 80-2 and FET X2 20-2 to be turned on, with all of the other six FETs in the BWCS 70-1 turned off. Both FET X8 80-2 and FET X2 20-2 would have the same well-compensated gate voltage $V_{gate}$ 210-2 applied to their respective gates, which would cause a value of $I_{drain}*2$ amps flowing from the drain of FET X2 20-2 and a value of $I_{drain}*128$ amps flowing from the drain of FET X8 80-2. At the output of the BWCS 70-1, the drain currents for each of the eight FETS X1 10-2 through X8 80-2 of the BWCS 70-1 are summed and output onto terminal 300-2. For the example given above, a total drain current of $(I_{drain}*128)+(I_{drain}*2)=I_{drain}*130$ amps will flow out of the BWCS 70-1 through terminal 300-2.

This output current having a value of $I_{drain}*130$ amps would then flow across output resistor R2 140-1, and an output voltage corresponding to the input digital word of 10000010 will thereby be read across R2 140-1.

In the first embodiment, the FET X9 60-1 of the bias circuit 10-1 has a gain equal to that of FET X7 70-2 of the BWCS 70-1. In other words, FET X9 60-1 of the bias circuit 10-1 has exactly the same operating characteristics as FET X7 70-2 of the BWCS 70-1. With this configuration, and since FET X7 70-2 of the BWCS 70-1 corresponds to bit $a_6$ of the digital word, the output voltage of the D/A ASIC is obtained from the following expression:

$$V_{out}=(V_{ref}/R1)*(Count/64)*R2+tm \quad (1),$$

where Count is the base 10 equivalent of the 8-bit binary word input to the BWCS 70-1.

Note that $V_{out}$ is a function of R2/R1, and as long as the ratio of R2 140-1 to R1 110-1 is kept within a precise range (i.e., 2 to 1), it does not matter that R2 140-1 and R1 110-1 have resistances that vary with temperature or in the manufacturing process of these devices. In the first embodiment, since R1=16 kohm, R2 =8 kohm, $V_{ref}$=1.2 volts, and the maximum Count=255 (for an 8-bit binary word), the maximum value of Vout is approximately equal to twice $V_{ref}$ or 2.4 volts. As can readily be seen from equation 1, above, by an appropriate choice of $V_{ref}$, R1, and R2, an appropriate analog output voltage range can be generated. In the first embodiment, this range is from 0 volts up to approximately 2.4 volts. Other ranges can be developed within the scope of the invention.

In the example as shown in FIG. 2, FET X2 60-1 of the BWCS 70-1 has an output drain current versus input gate voltage characteristic matched to FET X7 70-2 corresponding to bit $a_6$ of the BWCS 70-1. Thus, the currents from FETs X1 10-2 through X8 80-2 of the BWCS 70-1 are scaled as follows with respect to the current flowing from FET X9 60-1 of the bias circuit 10-1: 1/64, 1/32, 1/16, 1/8, 1/4, 1/2, 1, and 2. This relationship is due to the FETs X1 10-2 through X8 80-2 having the following respective gain factors: 1, 2, 4, 8, 16, 32, 64, and 128, where the gain factor corresponds to an amount of drain current output for a given amount of gate voltage applied to the FET. For example, with $V_{gate}$ 210-2 applied to each of the FETs X1 10-2 through X8 80-2, the respective drain currents from each of the FETs X1 10-2 through X8 80-2 are: $I_{drain}$, $I_{drain}*2$, $I_{drain}*4$, $I_{drain}*8$, $I_{drain}*16$, $I_{drain}*32$, $I_{drain}*64$, and $I_{drain}*128$.

Given that the FETs X1 10-2 through X8 80-2 have gain factors in increasing powers of two, the appropriate amount of drain current from the combination of FETs X1 10-2 through X8 80-2 will flow out of the output port 300-2 of the BWCS 70-1 for a given 8-bit digital word input to the BWCS 70-1. This output current will cause the appropriate amount of voltage to appear across output resistor R2 140-1 as the converted analog voltage corresponding to the 8-bit digital word $a_7a_6a_5a_4a_3a_2a_1a_0$.

In the first embodiment, FET X9 60-1 of the bias circuit 10-1 is set to be equivalent to FET X7 70-2 of the BWCS 70-1. However, other configurations can be envisioned in which FET X9 60-1 of the bias circuit 10-1 is set to be equivalent to another one of the FETs of the BWCS 70-1. For example, if FET X9 60-1 of the bias circuit 10-1 has a gain factor of 32, then it will be equivalent to FET X6 60-2 of the BWCS 70-1, which is the FET in the BWCS 70-1 corresponding to digital bit as. In this situation, the drain currents flowing from the FETs X1 10-2 through X8 80-2 will have the following values with respect to the drain current flowing from FET X9 60-1 of the bias circuit 10-1: 1/32, 1/16, 1/8, 1/4, 1/2, 1, 2, and 4. In this case, the voltage at R2 is calculated from the following equation:

$$V_{out}=(V_{ref}/R1)*(Count/32)*R2 \quad (2)$$

The current scaling due to the bias circuit and the resistor ratios are well controlled parameters, and therefore any deleterious effects introduced into the ASIC D/A due to the manufacturing process of the ASIC or temperature variations on the ASIC can be compensated for by the invention as described herein.

Referring back to FIG. 1, FET X10 150-1 has a gate connected to an input enable signal EN-L 160-1 via inverter U3 170-1, a source connected to $V_{dd}$ 30-1, and a drain connected to the output voltage 40-1 of U1 50-1. By this configuration, when the BWCS 70-1 is not enabled (i.e., EN-L 160-1 is at a High State), FET X10 150-1 ensures that the BWCS 70-1 is placed into a sleep mode (or low current mode), and none of the FETs X1 10-2 through X8 80-2 of the BWCS 70-1 are turned on.

Capacitor C1 190-1 is connected between the output 40-1 of U1 50-1 and Vdd 30-1, and in the first embodiment, has a capacitance of 20 picofarads. This capacitor C1 190-1 acts as a protection device for the D/A converter.

The FETs making up the BWCS 70-1 can have respective gains of any proportion, and not just binary weightings. For example, X1 could have a gain of $3^0=1$, X2 could have a gain of $3^1=3$, X3 could have a gain of $3^2=9, \ldots$, Xn could have a gain of $3^{n-1}$. By this choice of weightings, one can construct a ternary weighted current source. Other types of weightings could be chosen by one of ordinary skill in the art while still keeping within the teachings of the invention.

In the structure of the invention, the digital bits a7 . . . $A_0$ supplied to the BWCS 70-1 can be fixed, and $V_{ref}$ 100-1 can vary. By this implementation, the D/A ASIC will act as a multiplier/divider. For example, referring to the component values given in the first embodiment, if the digital word input to the BWCS 70-1 is 01000000 (i.e., a6=1, all other bits=0), then $$V_{out}=(V_{ref}/R1)*(Count/64)*R2=(V_{ref}/16\ k)*(64/64)*8\ k =V_{ref}/2.$$

Therefore, as $V_{ref}$ varies, the output of the D/A converter will correspond to a value equal to one-half of $V_{ref}$ and so the D/A converter acts as a "divide by 2" circuit with $V_{ref}$ being the input signal to be divided. In another configuration, one could choose R2=4*R1, for example, and for the digital word input to the BWCS 70-1 being 01000000 as before, this would then result in $V_{out}=4*V_{ref}$, with the D/A converter acting as a "multiply by 4" circuit with $V_{ref}$ being the input signal to be multiplied.

Figure 3:
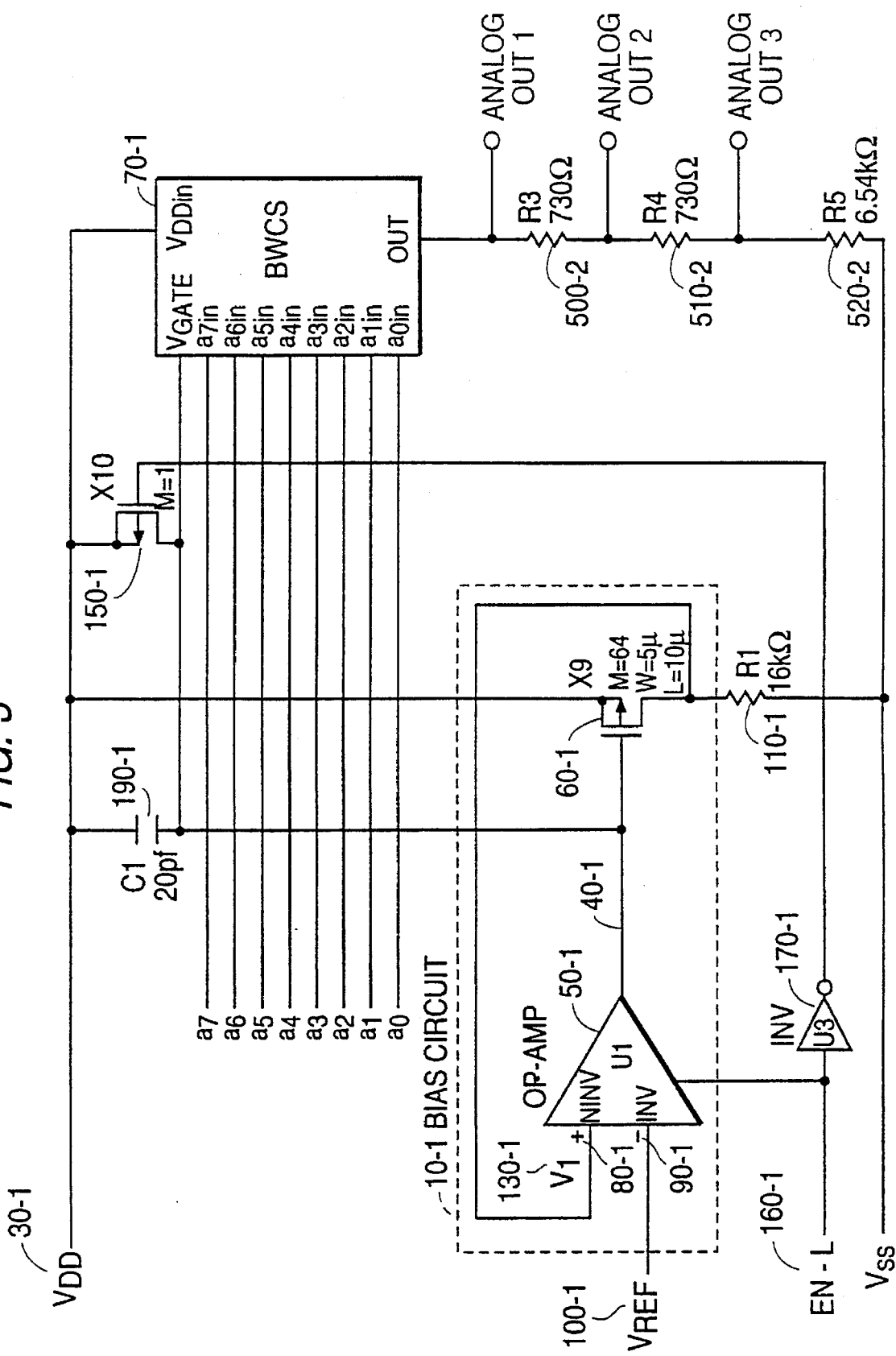
FIG. 3 is a block diagram of the D/A according to a second embodiment of the invention.

FIG. 3 shows a second embodiment of the invention. In this second embodiment, there are three resistors R3 500-2, R4 510-2, and R5 520-2 connected in a series relationship to the output port of the weighted current source 70-1, with the resistance values as shown in FIG. 3. With this configuration, the output analog voltage range may be varied anywhere from 90% to 110% of the output range of the first embodiment, or by any other range, given an appropriate choice of the resistance values for resistors R3 500-2, R4 510-2, and R5 520-2.

While preferred embodiments of the invention have been described, modifications of the described embodiments may become apparent to those of ordinary skill in the art, following the teachings of the invention, without departing from the scope of the invention as set forth in the appended claims.

What is claimed is:

1. A weighted current source, comprising:

n input ports, each port receiving a bit of an n-bit digital word to be converted to an analog signal, wherein n is an integer greater than one;

n on/off switches, each on/off switch having an on/off control port that receives a respective bit of said n-bit digital word, an input port for receiving a first fixed voltage, and an output port;

n off/on switches, each off/on switch having an on/off control port that receives a respective bit of said n-bit digital word, an input port for receiving a second fixed voltage, and an output port, wherein said first fixed voltage is different from said second fixed voltage;

n FETs each having a gate terminal respectively connected to an output port of a respective one of said n on/off switches and an output port of a respective one of said n off/on switches, each FET having a source terminal connected to receive said second fixed voltage, each FET having a drain terminal; and an output port connected to a drain terminal of each of said n FETs.

2. A weighted current source according to claim 1, further comprising a plurality of resistors connected to said output port, wherein an amount of current output from said output port of said weighted current source is supplied to said plurality of resistors, and wherein an analog voltage based on said n-bit digital word is capable of being measured across one of said plurality of resistors.

3. A weighted current source according to claim 2, wherein said plurality of resistors are integrated circuits that are manufactured from a same wafer lot.

4. A weighted current source according to claim 3, wherein a relative change in resistance in one of said plurality of resistors also substantially occurs in all others of said plurality of resistors.

5. A weighted current source according to claim 1, further comprising an n+1st FET having a source coupled to receive an external supply voltage, a gate coupled to receive an enable signal, and a source coupled to each gate of said n FETs.

6. A weighted current source according to claim 5, wherein, when the enable signal is in a first state indicating a command to inactivate the weighted current source, the n+1st FET becomes conductive, thereby causing a predetermined amount of voltage to appear at each gate of said n FETs, so as to turn off each of said n FETs.

7. A weighted current source according to claim 6, wherein, when the enable signal is in a second state indicating a command to activate the weighted current source, the n+1st FET becomes non-conductive, thereby causing a voltage below the predetermined amount of voltage to appear at each gate of said n FETs, so as to turn on each of said n FETs.

8. A weighted current source according to claim 1, wherein said n FETs are integrated circuits that are manufactured from a same wafer lot.

9. A weighted current source according to claim 8, wherein any relative change in transistor characteristics in one of said n FETs also substantially occurs in all others of said n FETs due to common manufacture of said n FETs, and wherein the respective transistor characteristics in said n FETs are kept substantially similar as a result thereof.

10. A weighted current source according to claim 1, wherein said second fixed voltage is greater than said first fixed voltage.

11. A weighted current source according to claim 1, wherein said n FETs have respective binary weightings in increasing powers of two to form a binary-weighted current source.

12. A weighted current source according to claim 1, wherein said n FETs are p-type devices.

13. A weighted current source according to claim 1, wherein each of said n FETs have a same channel width and length.

14. A weighted current source according to claim 1, wherein each of said n FETs has a different gain, the gains being proportional to an amount of drain current for an amount of gain voltage.

* * * * *